United States Patent
Watanabe et al.

(10) Patent No.: US 7,502,980 B2
(45) Date of Patent: Mar. 10, 2009

(54) SIGNAL GENERATOR, TEST APPARATUS, AND CIRCUIT DEVICE

(75) Inventors: Daisuke Watanabe, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 236 days.

(21) Appl. No.: 11/509,307

(22) Filed: Aug. 24, 2006

(65) Prior Publication Data
US 2008/0059091 A1  Mar. 6, 2008

(51) Int. Cl.
*G01R 31/28* (2006.01)
(52) U.S. Cl. ..................................... 714/738
(58) Field of Classification Search ............... 714/738
See application file for complete search history.

(56) References Cited

U.S. PATENT DOCUMENTS

| | | | |
|---|---|---|---|
| 6,232,759 B1 * | 5/2001 | Wohlfarth | 324/73.1 |
| 6,785,858 B2 * | 8/2004 | Niiro | 714/744 |
| 6,972,603 B2 * | 12/2005 | Mochizuki et al. | 327/155 |
| 7,085,982 B2 * | 8/2006 | Shinbo et al. | 714/740 |
| 7,254,345 B2 * | 8/2007 | Suzaki et al. | 398/202 |

FOREIGN PATENT DOCUMENTS

| | | |
|---|---|---|
| JP | 60-153214 | 8/1985 |
| JP | 61-164319 | 7/1986 |
| JP | 61-186012 | 8/1986 |
| JP | 2002-40112 | 2/2002 |

OTHER PUBLICATIONS

International Search Report issued in PCT Application No. PCT/JP2007/060783 mailed Jul. 3, 2007, 2 pages.

* cited by examiner

*Primary Examiner*—James C Kerveros
(74) *Attorney, Agent, or Firm*—Osha • Liang LLP (57) ABSTRACT

A signal generator for generating an output signal corresponding to pattern data includes (i) a plurality of timing generators that generate a plurality of periodic signals each having a different phase with respect to a reference clock, (ii) a shift register section including a plurality of flip-flops in a cascade arrangement through which each piece of pattern data is propagated sequentially in response to a first periodic signal output from a first timing generator, (iii) a plurality of registers that are provided in a cascade arrangement each of which sequentially propagates data output from a pre-selected one of the plurality of flip-flops in response to a periodic signal output from a corresponding one of the plurality of timing generators, and (iv) a waveform generating section that generates a waveform of the output signal based on data values output from the plurality of flip-flops and from the plurality of registers.

10 Claims, 7 Drawing Sheets

SIGNAL GENERATOR, TEST APPARATUS, AND CIRCUIT DEVICE

BACKGROUND

1. Field of the Invention

The present invention relates to a signal generator, a test apparatus and a circuit device. The present invention particularly relates to a signal generator that can freely correct the waveform of an output signal.

2. Related Art

A typical method of testing a device under test (DUT) such as a semiconductor circuit is to input a predetermined signal into the DUT, and measure an output signal from the DUT to judge whether the DUT is good or bad. For example, the signal input into the DUT has a predetermined logical pattern, and the output signal from the DUT is judged whether to have a logical pattern matching an expected value pattern so as to determine whether the DUT operates normally or not.

According to the above-described testing method, the test apparatus inputs the predetermined signal into the DUT. Here, this signal may attenuate while being transmitted on the path from the test apparatus to the DUT. If such attenuation occurs, the signal input into the DUT may have a different logical pattern from a logical pattern that is designated to be input into the DUT.

To solve this problem, the typical test apparatus has a function to correct the waveform of the test signal in advance based on the potential signal attenuation on the transmission path. For example, the test apparatus generates a plurality of pulse signals having different pulse widths based on the timing of the edge of the test signal, and adds the waveforms of these pulse signals to the waveform of the test signal. Thus, the test apparatus sharpens the edge portion of the test signal (see unexamined Japanese Patent Application Publication No. 2002-40112, for example).

Here, such a typical test apparatus can sharpen the edge of the test signal, but can not freely correct the waveform of the test signal. To be specific, since the test apparatus corrects the test signal by adding the pulse widths of the pulse signals generated based on the timing of the edge of the test signal, the test apparatus can not make a correction to compensate a reflected wave and the like which may occur in a phase that is temporally distant from the edge, for example. In addition, the typical test apparatus can sharpen the edge, but can not blunt the edge.

For the reasons stated above, the typical test apparatus can not always test the DUT accurately. Furthermore, it has not been possible to test quantitatively a waveform equalizing function of the DUT when the device has a function of restoring an attenuated test signal, that is to say, a waveform equalizing circuit.

SUMMARY

An advantage of some aspects of the present invention is to provide a signal generator, a test apparatus, and a circuit device which can remove the above-described drawbacks. This is achieved by combining the features recited in the independent claims. The dependent claims define further effective specific example of the present invention.

A first embodiment of the invention provides a signal generator for generating an output signal corresponding to pattern data supplied thereto. The signal generator includes (i) a plurality of timing generators that, based on a reference clock supplied thereto, generate a plurality of periodic signals each having a different phase with respect to the reference clock, (ii) a shift register section including a plurality of flip-flops in a cascade arrangement through which each piece of data of the pattern data is propagated sequentially in response to a first periodic signal output from a first timing generator, where the first periodic signal is one of the plurality of periodic signals and the first timing generator is one of the plurality of timing generators, (iii) a plurality of registers that are provided in a cascade arrangement and in a one-to-one correspondence with the plurality of timing generators excluding the first timing generator, where each of the plurality of registers sequentially propagates data output from a pre-selected one of the plurality of flip-flops in response to a periodic signal output from a corresponding one of the plurality of timing generators, and (iv) a waveform generating section that generates a waveform of the output signal based on data values output from the plurality of flip-flops and data values output from the plurality of registers.

The waveform generating section may include a plurality of calculating circuits that are provided in a one-to-one correspondence with the plurality of flip-flops and the plurality of registers, where each of the plurality of calculating circuits multiplies, by a predetermined coefficient, a data value output from a corresponding one of the plurality of flip-flops and the plurality of registers and outputs a signal indicating a level set in accordance with a result of the multiplication, and an output section that adds together waveforms of the signals output from the plurality of calculating circuits, and outputs a resulting signal as the output signal.

The waveform generating section may further include a plurality of sign control circuits that are provided in a one-to-one correspondence with the plurality of flip-flops and the plurality of registers, where each of the plurality of sign control circuits determines a sign for a data value output from a corresponding one of the plurality of flip-flops and the plurality of registers.

The signal generator may further include a tap control section that selects a data value output from the pre-selected flip-flop from data values output from the plurality of flip-flops, and inputs the selected data value into a first-stage register among the plurality of registers.

Here, edges of the plurality of periodic signals excluding the first periodic signal may be more densely distributed in a vicinity of an edge of the first periodic signal.

Here, a difference in phase between the first periodic signal and a periodic signal output from one of the plurality of timing generators excluding the first timing generator may be set larger than a cycle of the first periodic signal.

A second embodiment of the invention provides a test apparatus for testing a device under test. The test apparatus includes (i) a pattern generator that generates a test pattern to test the device, (ii) a signal generator that generates a test signal to be input into the device, based on the test pattern, and (iii) a judging section that judges whether the device is good or bad based on a signal output from the device. Here, the signal generator includes (I) a plurality of timing generators that, based on a reference clock supplied thereto, generate a plurality of periodic signals each having a different phase with respect to the reference clock, (II) a shift register section including a plurality of flip-flops in a cascade arrangement through which each piece of data of the test pattern is propagated sequentially in response to a first periodic signal output from a first timing generator, where the first periodic signal is one of the plurality of periodic signals and the first timing generator is one of the plurality of timing generators, (III) a plurality of registers that are provided in a cascade arrangement and in a one-to-one correspondence with the plurality of timing generators excluding the first timing generator, where each of the plurality of registers sequentially propagates data output from a pre-selected one of the plurality of flip-flops in response to a periodic signal output from a corresponding one of the plurality of timing generators, and (IV) a waveform generating section that generates a waveform of the test signal based on data values output from the plurality of flip-flops and data values output from the plurality of registers.

The waveform generating section may include a plurality of calculating circuits that are provided in a one-to-one correspondence with the plurality of flip-flops and the plurality of registers, where each of the plurality of calculating circuits multiplies, by a predetermined coefficient, a data value output from a corresponding one of the plurality of flip-flops and the plurality of registers and outputs a signal indicating a level set in accordance with a result of the multiplication, and an output section that adds together waveforms of the signals output from the plurality of calculating circuits, and outputs a resulting signal as the test signal.

The test apparatus may further include a calibrating section that calibrates the signal generator before the test apparatus tests the device. The calibrating section may include a reference generating section that causes the signal generator to output a reference signal having a predetermined waveform, a reference measuring section that measures the reference signal at a point when the reference signal is input into an input terminal of the device, and a control section that determines the coefficients for the plurality of calculating circuits based on a waveform of the reference signal measured by the reference measuring section.

A third embodiment of the invention provides a circuit device for outputting a signal having a desired waveform. The circuit device includes a pattern generator that generates a waveform pattern for the output signal, and a signal generator that generates the output signal based on the waveform pattern. The signal generator includes (i) a plurality of timing generators that, based on a reference clock supplied thereto, generate a plurality of periodic signals each having a different phase with respect to the reference clock, (ii) a shift register section including a plurality of flip-flops in a cascade arrangement through which each piece of data of the waveform pattern is propagated sequentially in response to a first periodic signal output from a first timing generator, where the first periodic signal is one of the plurality of periodic signals and the first timing generator is one of the plurality of timing generators, (iii) a plurality of registers that are provided in a cascade arrangement and in a one-to-one correspondence with the plurality of timing generators excluding the first timing generator, where each of the plurality of registers sequentially propagates data output from a pre-selected one of the plurality of flip-flops in response to a periodic signal output from a corresponding one of the plurality of timing generators, and (iv) a waveform generating section that generates a waveform of the output signal based on data values output from the plurality of flip-flops and data values output from the plurality of registers.

Here, all the necessary features of aspects of the present invention are not listed in the summary. The sub-combinations of the features may become the invention.

DESCRIPTION OF EXEMPLARY EMBODIMENTS

Hereinafter, embodiments of the present invention will be described. The embodiments do not limit the invention according to the claims, and all the combinations of the features described in the embodiments are not necessarily essential to the means provided by aspects of the invention.

Figure 1:
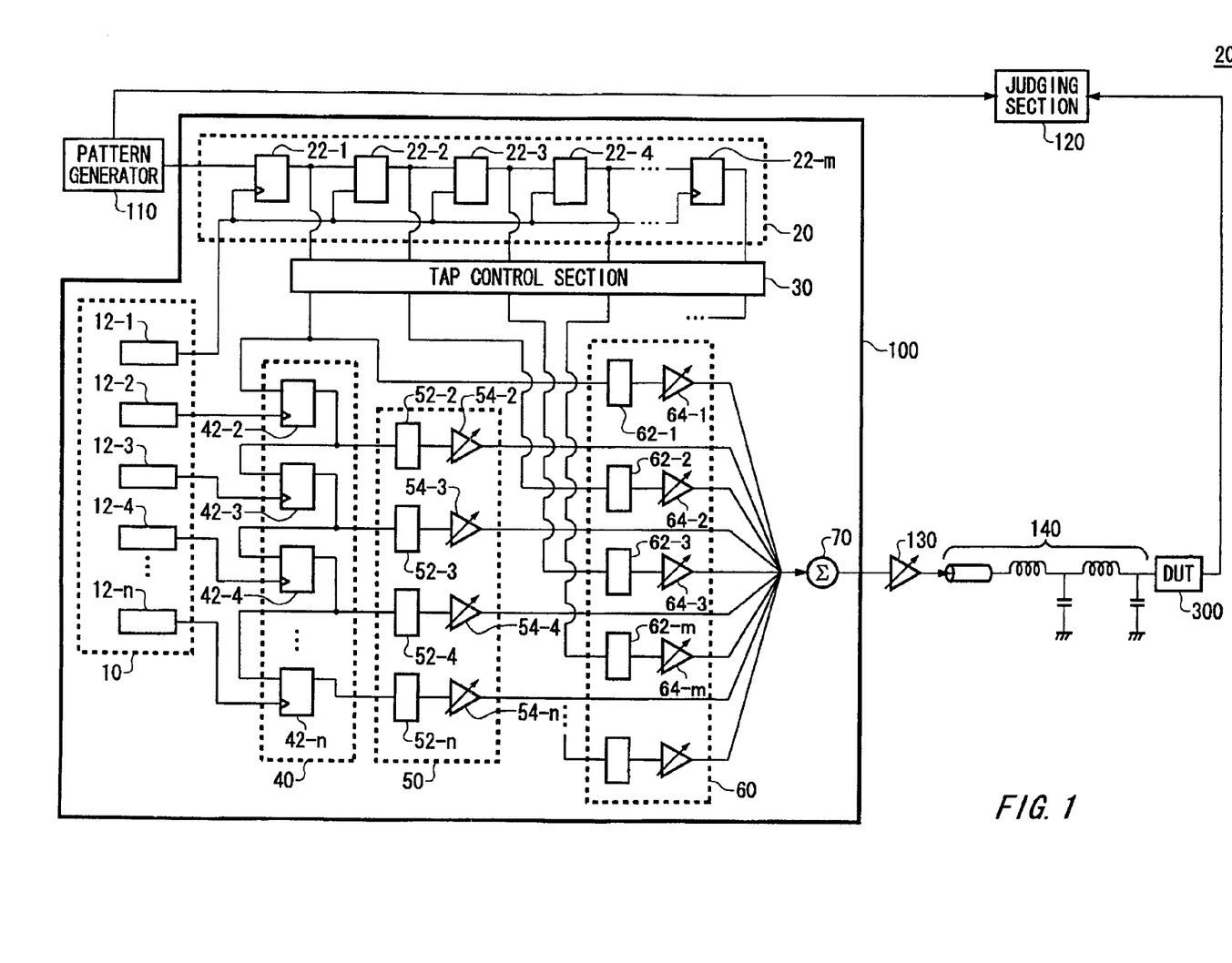
FIG. 1 shows an example of a configuration of a test apparatus 200 relating to an embodiment of the invention.

FIG. 1 shows an example of the configuration of a test apparatus 200 relating to an embodiment of the invention. The test apparatus 200 tests a device under test (DUT) 300, which is a semiconductor circuit for example. For example, the test apparatus 200 inputs a signal having a predetermined logical pattern into the DUT 300, and compares the logical pattern of a signal output from the DUT 300 with an expected value pattern, to determine whether the DUT 300 is good or bad. The test apparatus 200 relating to the embodiment includes a signal generator 100, a pattern generator 110, a judging section 120, an amplifier 130, and a transmission path 140.

The pattern generator 110 generates a test pattern to test the DUT 300. For example, the pattern generator 110 generates a test pattern including a logical pattern (pattern data) that should be included in a signal to be input into the DUT 300.

The signal generator 100 generates a test signal to be input into the DUT 300, on the basis of the test pattern generated by the pattern generator 110. For example, the signal generator 100 generates a test signal indicating a level corresponding to the pattern data included in the test pattern. In addition, the signal generator 100 corrects the waveform of the test signal in advance. The configuration and operation of the signal generator 100 will be later described in detail.

The amplifier 130 amplifies the test signal generated by the signal generator 100 at a predetermined amplification ratio, and outputs the amplified test signal. Also, the amplifier 130 may output the test signal by setting a predetermined signal level as a reference level. For example, the amplifier 130 may amplify the test signal at a predetermined amplification ratio, add a predetermined offset voltage to the test signal, and output the resulting test signal.

The transmission path 140 transmits the test signal output from the amplifier 130 to an input terminal of the DUT 300. The transmission path 140 may be a wiring such as a cable. The transmission path 140 may cause a predetermined degree of attenuation or a predetermined reflected wave, in the test signal.

The judging section 120 judges whether the DUT 300 is good or bad based on a signal output from the DUT 300. For example, the judging section 120 may make such judgment by comparing the logical pattern of the output signal with an expected value pattern supplied from the pattern generator 110. Here, the pattern generator 110 generates the expected value pattern based on the test pattern.

The signal generator 100 includes a timing generating section 10, a shift register section 20, a register section 40, and a waveform generating section. In this embodiment, the waveform generating section includes a first calculating section 50, a second calculating section 60, and an output section 70.

The timing generating section 10 includes a plurality of timing generators (12-1 to 12-n, hereinafter collectively referred to as timing generators 12) that use a supplied reference clock to generate a plurality of periodic signals each having a different phase with respect to the reference clock. In other words, the timing generators 12 generate periodic signals that all have substantially the same cycle but each have a different phase. Each of the timing generators 12 may be a PLL circuit. Alternatively, one of the timing generators 12 which is designated as a reference circuit may be a PLL circuit and the rest may be delay circuits. If this is the case, the reference timing generator 12 generates a first periodic signal, which then branches to be received by the rest of the timing generators 12. Each of the rest of the timing generators 12 may delay the received first periodic signal by a different delay amount.

The shift register section 20 includes a plurality of flip-flops in a cascade arrangement (22-1 to 22-m, hereinafter collectively referred to as flip-flops 22). Through the flip-flops 22, each piece of data of the pattern data output from the pattern generator 110 is propagated sequentially. Each of the flip-flops 22 receives the first periodic signal which is output from a first timing generator 12-1 as a clock frequency, and propagates each piece of data of the pattern data to the next-stage flip-flop 22 in response to the first periodic signal.

The second calculating section 60 includes a plurality of sign control circuits (62-1 to 62-m, hereinafter collectively referred to as sign control circuits 62) and a plurality of calculating circuits (64-1 to 64-m, hereinafter collectively referred to as calculating circuits 64), provided in a one-to-one correspondence with the flip-flops 22. Each of the sign control circuits 62 determines the sign of a data value output from a corresponding one of the flip-flops 22. To be specific, each sign control circuit 62 selects a positive or negative sign for the data value output from the corresponding flip-flop 22, and then outputs the data value. Here, a user may designate, in advance, which one of positive and negative signs is to be selected by each of the sign control circuits 62. While the signal generator 100 is operating, the sign selected by each of the sign control circuits 62 may or may not be varied.

Each of the calculating circuits 64 receives a data value output from a corresponding one of the flip-flops 22 via a corresponding one of the sign control circuits 62. Each calculating circuit 64 multiplies the received data value by a predetermined coefficient, and outputs a signal indicating a level set in accordance with the multiplication result. Each calculating circuit 64 may be an amplifier having an amplification ratio corresponding to the coefficient. While the signal generator 100 is operating, the coefficient of each calculating circuit 64 may or may not be varied.

The output section 70 adds together the waveforms of the signals output from the calculating circuits 64, and outputs the result of the addition. With the above-described configuration, the signal generator 100 can correct the waveform of the output signal based on the edge of the first periodic signal by using the pattern data.

The register section 40 includes a plurality of registers (42-2 to 42-n, hereinafter collectively referred to as registers 42) provided in a one-to-one correspondence with the timing generators 12-2 to 12-n which do not include the first timing generator 12-1. The registers 42 are in a cascade arrangement, that is to say, output data from each of the registers 42 is input into the next-stage register 42. Each of the registers 42 receives the input data in response to a periodic signal output from a corresponding one of the timing generators 12, and outputs the received data. In this embodiment of the invention, the first-stage register 42 receives data output from a pre-selected one of the flip-flops 22. The data is propagated sequentially in response to the periodic signals output from the timing generators 12.

The first calculating section 50 includes a plurality of sign control circuits (52-2 to 52-n, hereinafter collectively referred to as sign control circuits 52) and a plurality of calculating circuits (54-2 to 54-n, hereinafter collectively referred to as calculating circuits 54), provided in a one-to-one correspondence with the registers 42. Each of the sign control circuits 52 determines the sign of a data value output from a corresponding one of the registers 42. To be specific, each sign control circuit 52 selects a positive or negative sign for the data value output from the corresponding register 42, and then outputs the data value. Here, the user may designate, in advance, which one of positive and negative signs is to be selected by each of the sign control circuits 52. While the signal generator 100 is operating, the sign selected by each of the sign control circuits 52 may or may not be varied.

Each of the calculating circuits 54 receives a data value output from a corresponding one of the registers 42 via a corresponding one of the sign control circuits 52. Each calculating circuit 54 multiplies the received data value by a predetermined coefficient, and outputs a signal indicating a level set in accordance with the multiplication result. Each calculating circuit 54 may be an amplifier having an amplification ratio corresponding to the coefficient. While the signal generator 100 is operating, the coefficient of each calculating circuit 54 may or may not be varied.

The output section 70 adds together the waveforms of the signals output from the calculating circuits 54, and outputs the result of the addition. In other words, the output section 70 outputs a signal indicating a result of adding together the waveforms of the signals output from the calculating circuits 54 and 64. With the above-described configuration, the signal generator 100 can correct the waveform of the output signal based on a timing other than the first periodic signal.

The user may freely set the phase of the periodic signal output from each of the timing generators 12, with respect to the first periodic signal. With this configuration, the signal generator 100 can correct the waveform of the output signal based on a desired timing. For example, the signal generator 100 can generate a waveform corresponding to the signal edge of the output signal (the edge timing of the first periodic signal) in a phase (the edge timing of a different periodic signal) which is temporally distant from the signal edge. Therefore, the signal generator 100 can generate, in advance, in the output signal, a waveform to offset a reflected wave which may occur on the transmission path 140. Thus, the signal generator 100 can accurately input a desired signal into the DUT 300.

A tap control section 30 selects one of the data values output from the flip-flops 22, and inputs the selected data value into the first-stage register 42. Having this configuration, the signal generator 100 can select which one of the data values output from the flip-flops 22 is to be used as a reference to correct the waveform of the output signal. The user may designate in advance which one of the flip-flops 22 is to be selected by the tap control section 30.

Also, the tap control section 30 is configured to input the data value output from each of the flip-flops 22 into a corresponding one of the sign control circuits 62. The user may designate in advance how the flip-flops 22 and sign control circuits 62 are related to each other. While the signal generator 100 is operating, the settings for the tap control section 30 may not be changed.

Figure 2:
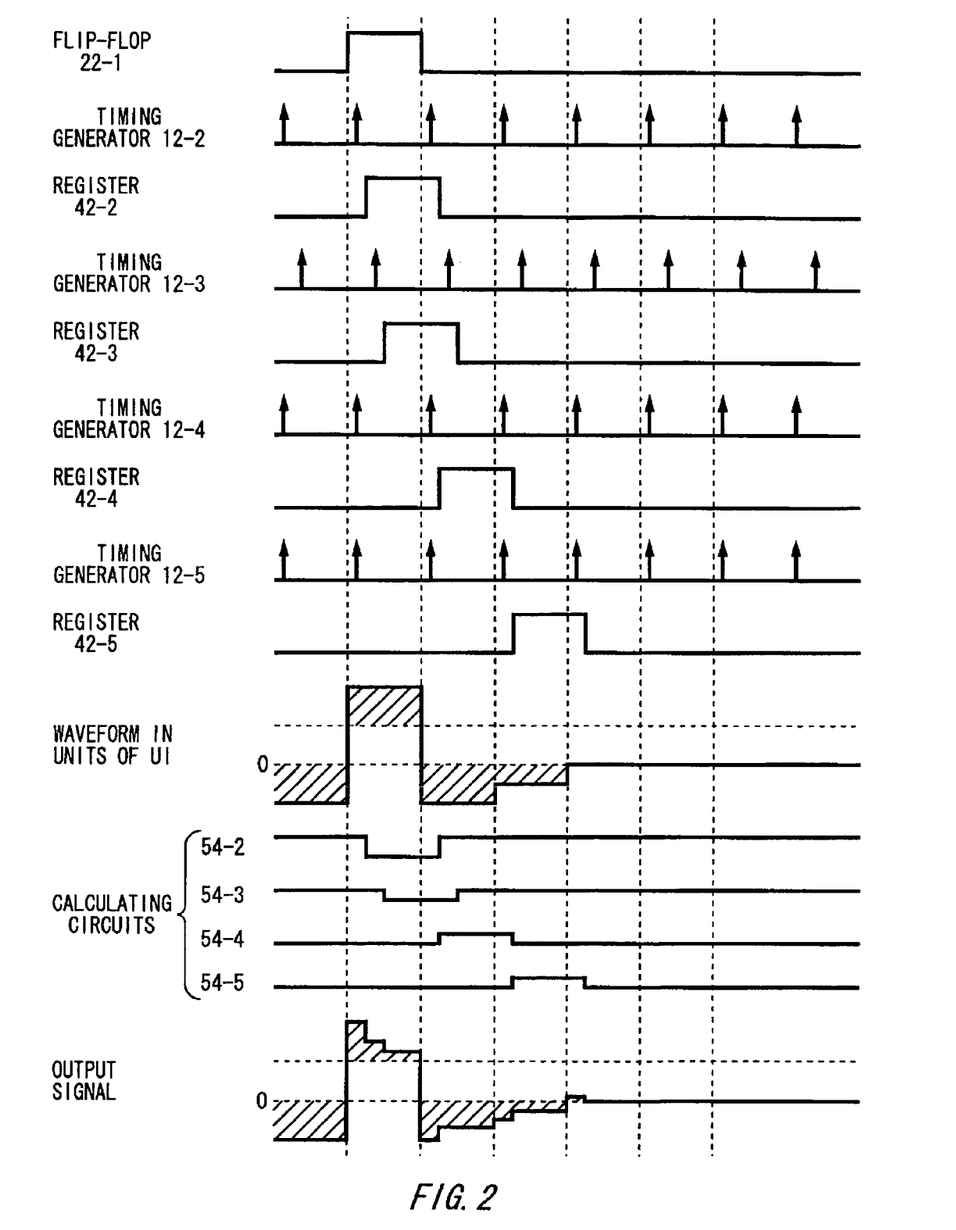
FIG. 2 is a timing chart showing an operation performed by a signal generator 100 as an example.

FIG. 2 is a timing chart showing the operation performed by the signal generator 100 as an example. FIG. 2 is mainly used to explain the waveform correction performed by the first calculating section 50. In this embodiment, the number of timing generators 12 is set to five, and the tap control section 30 selects the data output from the flip-flop 22-1, and inputs the selected data into the first-stage register 42-2.

The flip-flop 22-1 propagates the data value output from the pattern generator 110 in response to the first periodic signal. As shown in FIG. 2, when the flip-flop 22-1 outputs a data value "1", the register 42-2 receives the data value "1" in response to a second periodic signal output from the corresponding timing generator 12-2, and outputs the received data value. In a similar manner, each of the subsequent-stage registers 42 receives the data value output from the previous-stage register 42 in response to a periodic signal output from a corresponding one of the timing generators 12, and outputs the received data value.

Each of the calculating circuits 54 outputs a signal generated based on the data value output from a corresponding one of the registers 42 as shown in FIG. 2. As described above, each calculating circuit 54 multiplies the data value output from the corresponding register 42 by a predetermined coefficient, and outputs a signal indicating a level set in accordance with the multiplication result. Each of the sign control circuits 52 selects the sign for the signal output from a corresponding one of the calculating circuits 54.

The output section 70 adds together the waveforms of the signals output from the calculating circuits 54, to correct the waveform of the output signal. To this calculation, the output section 70 also adds a waveform in units of unit interval (UI) which is generated by the second calculating section 60. This waveform can be generated by using a typical method, which is therefore not illustrated herein.

Referring to FIG. 2, the shaded regions are the regions corrected by the first and second calculating sections 50 and 60. As shown in FIG. 2, the signal generator 100 can correct the waveform of the output signal by using a plurality of periodic signals having different phases, thereby realizing highly variable waveform correction.

As described above, the signal generator 100 relating to the present embodiment can perform waveform correction, by using the pattern data to generate the output signal, in units of UI of the output signal and based on a desired timing. Having such a configuration, the embodiment can accurately correct the waveform of the output signal, thereby enabling the test apparatus 200 to accurately test the DUT 300.

Figure 3A:
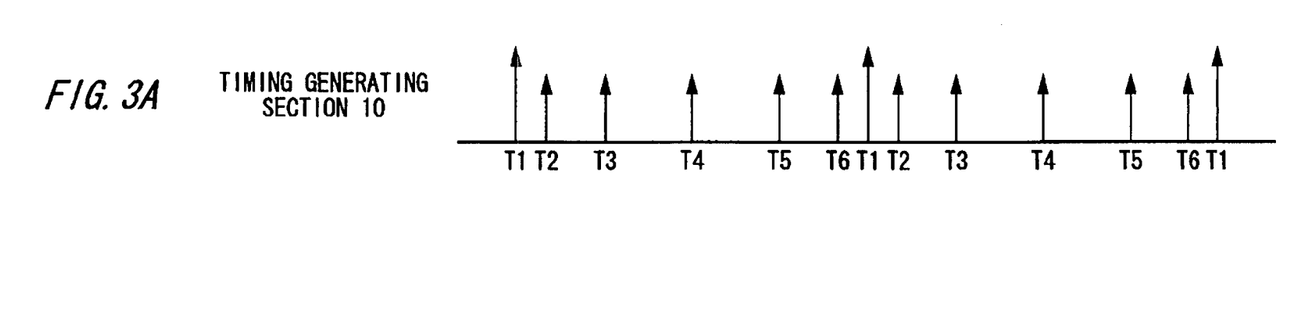
FIG. 3A shows the edge timings of periodic signals as an example.
Figure 3B:
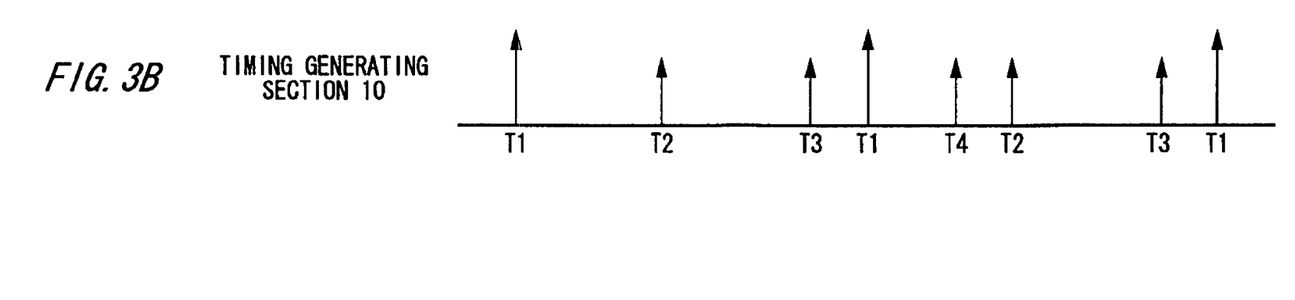
FIG. 3B shows the edge timings of periodic signals as an example

FIGS. 3A and 3B each show the edge timings of the periodic signals as an example. The timing generating section 10 may output the periodic signals in such a manner that the edge timings of the periodic signals excluding the first periodic signal are more densely distributed in the vicinity of the edge timing of the first periodic signal, as shown in FIG. 3A. With this configuration, the signal generator 100 can correct a portion of the waveform of the output signal which is in the vicinity of the signal edge in a finer manner.

Alternatively, the timing generating section 10 may output the periodic signals in such a manner that a difference in phase between a periodic signal output from one of the timing generators 12 and the first periodic signal is set larger than the UI (the cycle of the first periodic signal), as shown in FIG. 3B. With this configuration, the signal generator 100 can generate a waveform to offset a reflected wave that may occur in a phase temporally distant from a pulse of the output signal by a time equal to the UI or longer, for example.

Figure 4:
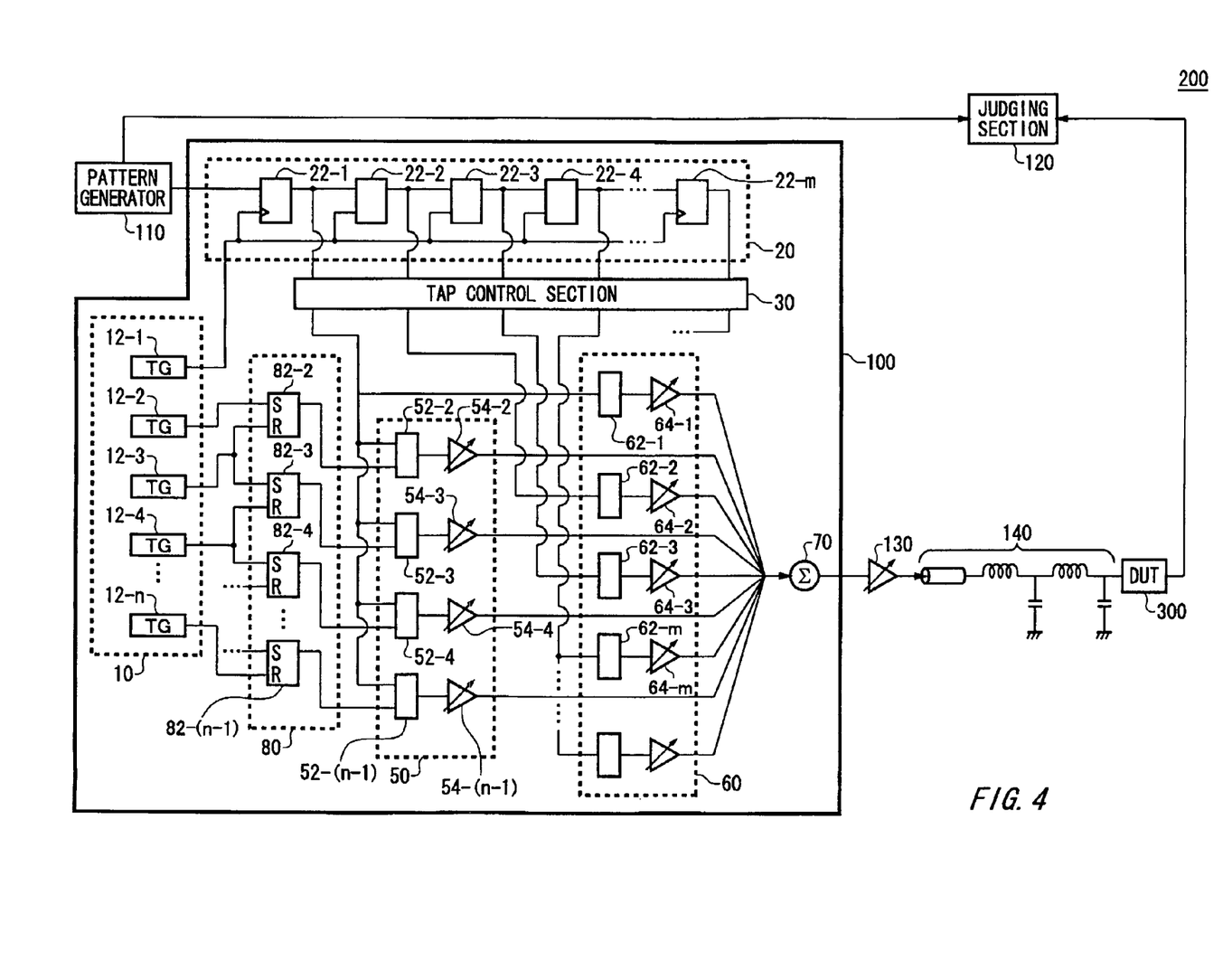
FIG. 4 shows another example of the configuration of the signal generator 100.

FIG. 4 shows another example of the configuration of the signal generator 100. The signal generator 100 relating to this embodiment is different in that the resister section 40 is replaced with a set-reset latch section 80. The other constituents indicated by the same reference numerals as in FIG. 1 have the same or similar functions and configurations as/to the corresponding constituents of the previous embodiment.

The set-reset latch section 80 includes a plurality of set-reset latches (82-2 to 82-(n−1), hereinafter collectively referred to as set-reset latches 82) in a one-to-one correspondence with the timing generators (12-2 to 12-(n−1)), which do not include the first timing generator 12-1 and the last-stage timing generator 12-n. Each of the set-reset latches 82 receives a periodic signal from a corresponding one of the timing generators 12 and a periodic signal from the next-stage timing generator 12. Here, the next-stage timing generator 12 may output a periodic signal having a phase delayed by the smallest amount with respect to the phase of the periodic signal output from the corresponding timing generator 12.

Each set-reset latch 82 maintains the output of a signal indicating a logical value "1" during a time period defined by the edge of the periodic signal received from the corresponding timing generator 12 and the edge of the periodic signal received from the next-stage timing generator 12.

The tap control section 30 inputs the data value output from a selected one of the flip-flops 22 into each of the sign control circuits 52. Each sign control circuit 52 selects a sign for the received data value and outputs the data value, when a corresponding one of the set-reset latches 82 outputs the logical value "1".

According to this embodiment, the signal generator 100 can correct the waveform of the output signal at a desired timing based on the edge of each of the periodic signals, and by using a desired pulse width based on the difference in phase between the periodic signals. With this configuration, the signal generator 100 can perform very fine waveform correction, for example, by reducing the difference in phase between the periodic signals output from adjacent two of the timing generators 12.

Figure 5:
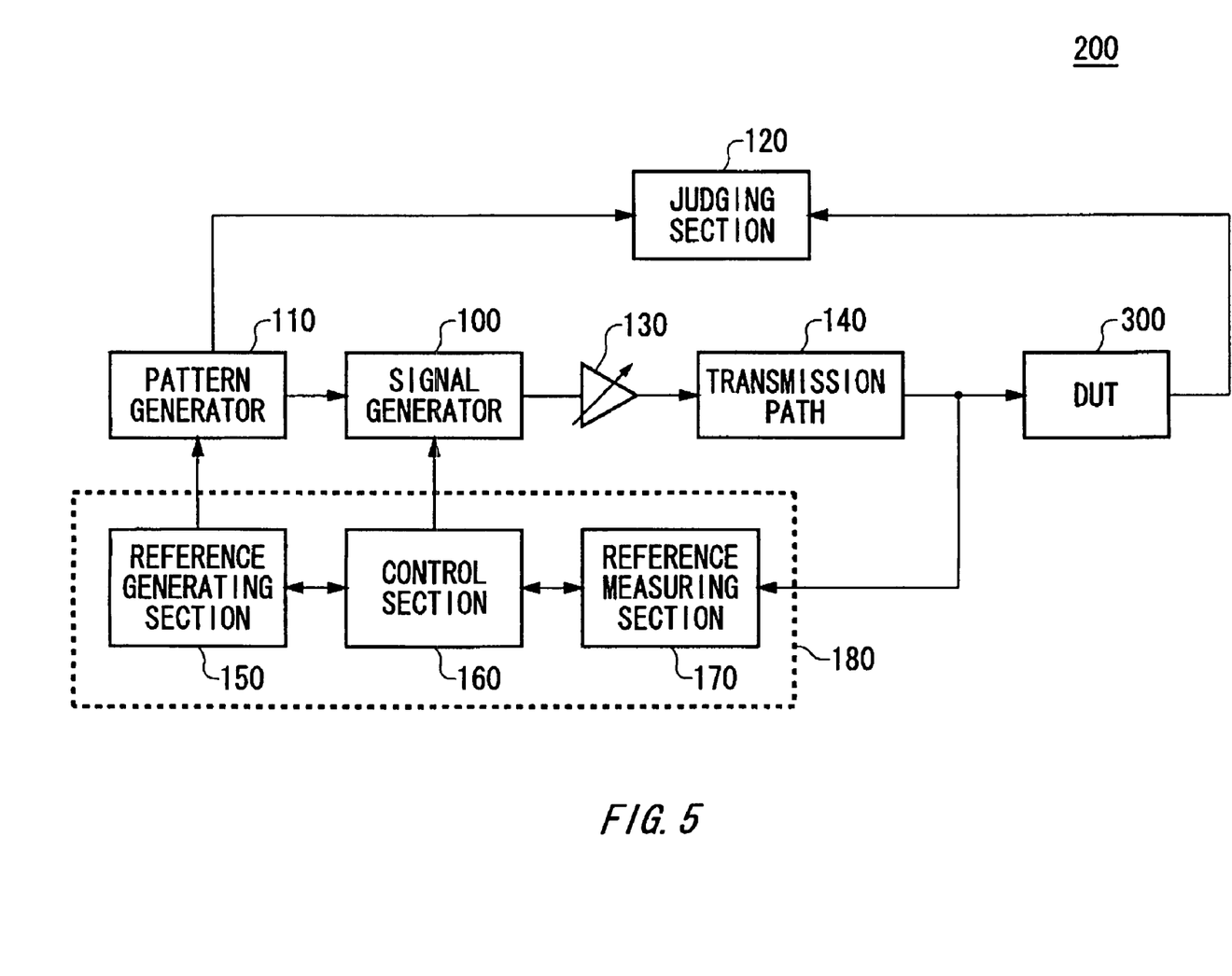
FIG. 5 shows another example of the configuration of the test apparatus 200.

FIG. 5 shows another example of the configuration of the test apparatus 200. According to this embodiment, the test apparatus 200 includes a calibrating section 180 in addition to the constituents shown in FIG. 1. The other constituents indicated by the same reference numerals as in FIG. 1 have the same or similar functions and configurations as/to the corresponding constituents in the previous embodiment.

The calibrating section 180 calibrates the signal generator 100 before the test apparatus 200 tests the DUT 300. The calibrating section 180 includes a reference generating section 150, a control section 160, and a reference measuring section 170.

The reference generating section 150 causes the signal generator 100 to output a reference signal having a predetermined waveform. In this embodiment, the reference generating section 150 causes the pattern generator 110 to output predetermined pattern data.

The reference measuring section 170 measures the waveform of the reference signal at a point when the reference signal is input into the input terminal of the DUT 300. The control section 160 determines the settings for the first and second calculating sections 50 and 60 based on the waveform of the reference signal measured by the reference measuring section 170. In detail, the control section 160 may set the signs selected by the sign control circuits 52 and 62, and set the weight coefficients for the calculating circuits 54 and 64. Furthermore, the control section 160 may set the phases of the periodic signals output from the timing generators 12.

Figure 6:
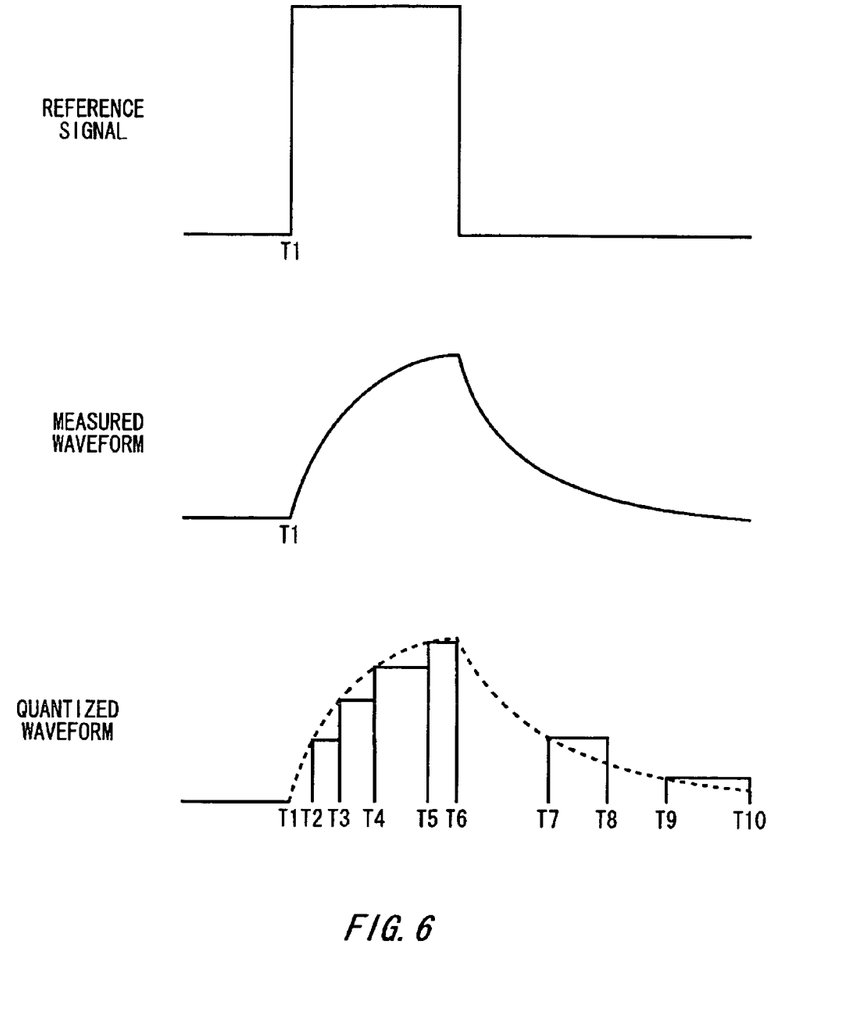
FIG. 6 shows an operation performed by a calibrating section 180 as an example.

FIG. 6 shows the operation performed by the calibrating section 180 as an example. As mentioned above, the reference generating section 150 causes the signal generator 100 to output a predetermined reference signal, and the reference measuring section 170 measures the waveform of the reference signal at a point when the reference signal is input into the input terminal of the DUT 300.

The control section 160 quantizes the waveform measured by the reference measuring section 170 as shown in FIG. 6. Based on the quantized waveform, the control section 160 then detects attenuation and the like of the reference signal which may have occurred on the transmission path 140, and calibrates the signal generator 100 based on the detection result.

For example, the control section 160 approximates the quantized waveform by a plurality of pulses. By using the phases and pulse widths of the pulses, the control section 160 may control the phases of the periodic signals output from the timing generators 12. Also, the control section 160 may control the weight coefficients for the calculating circuits 54 and 64 based on the levels of the rectangular waves. In addition, the control section 160 may compare the waveform of the reference signal with the quantized waveform, in order to judge whether to superimpose or reduce the components of the rectangular waves of the quantized waveform on/from the reference signal in advance. Based on the judgment, the control section 160 may control the signs to be selected by the sign control circuits 52 and 62.

According to the above description with reference to FIGS. 1 to 6, the signal generator 100 corrects the waveform of the output signal in advance to compensate the attenuation, reflection or the like that may occur on the transmission path 140. Additionally, the signal generator 100 has a different function. For example, the signal generator 100 may degrade the waveform of the output signal, and input the resulting signal into the DUT 300. This can detect the maximum level of degradation in the waveform of the output signal which allows the DUT 300 to operate normally.

Figure 7:
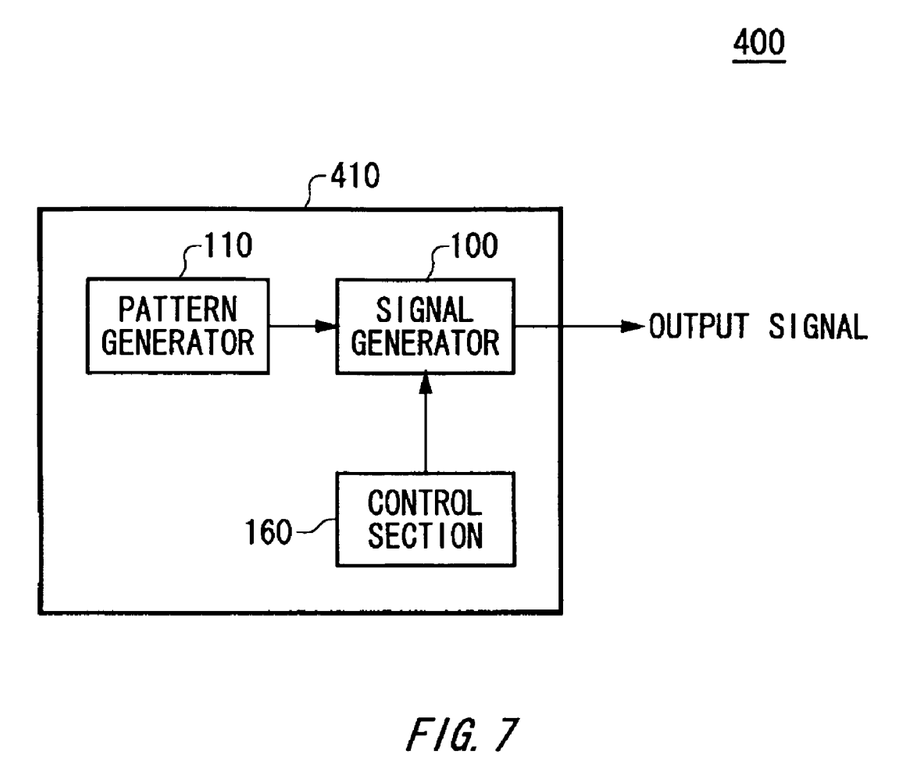
FIG. 7 shows an exemplary configuration of a circuit device 400 relating to another embodiment of the invention.

FIG. 7 shows an exemplary configuration of a circuit device 400 relating to another embodiment of the invention. The circuit device 400 may include a semiconductor circuit, for example. The circuit device 400 includes a substrate 410, the pattern generator 110, the signal generator 100, and the control section 160. The substrate 410 may be a semiconductor substrate, for example. The signal generator 100, pattern generator 110, and control section 160 may be circuits formed in the substrate 410.

The signal generator 100, pattern generator 110, and control section 160 have the same or similar configurations and functions as/to the constituents identified by the same reference numerals in FIGS. 1 to 6. In this embodiment, the control section 160 may prestore therein information relating to the settings of the signal generator 100 such as the signs, weight coefficients and phases of the periodic signals. Alternatively, the control section 160 may adjust the signal generator 100 based on settings data provided from outside.

Having the above-described configuration, the circuit device 400 can output a signal having a desired waveform.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As clearly indicated above, some embodiments of the present invention can realize a signal generator that can correct the waveform of an output signal based on a desired phase. In addition, the embodiments of the present invention can realize a test apparatus that can accurately test a DUT.

What is claimed is:

1. A signal generator for generating an output signal corresponding to pattern data, the signal generator comprising:

a plurality of timing generators that, based on a reference clock, generate a plurality of periodic signals each having a different phase with respect to the reference clock;

a shift register section including a plurality of flip-flops in a cascade arrangement through which each piece of data of the pattern data is propagated sequentially in response to a first periodic signal output from a first timing generator, the first periodic signal being one of the plurality of periodic signals and the first timing generator being one of the plurality of timing generators;

a plurality of registers that are provided in a cascade arrangement and in a one-to-one correspondence with the plurality of timing generators excluding the first timing generator, each of the plurality of registers sequentially propagating data output from a pre-selected one of the plurality of flip-flops in response to a periodic signal output from a corresponding one of the plurality of timing generators; and a waveform generating section that generates a waveform of the output signal by multiplying a signal output from said plurality of flip-flops by a first predetermined coefficient, multiplying a signal output from said plurality of registers by a second predetermined coefficient, and adding together waveforms of the multiplied signals.

2. The signal generator according to claim 1, wherein the waveform generating section includes:

a plurality of calculating circuits that are provided in a one-to-one correspondence with the plurality of flip-flops and the plurality of registers, each of the plurality of calculating circuits multiplying, by the first predetermined coefficient, a data value output from a corresponding one of the plurality of flip-flops and, by the second predetermined coefficient, a data value output from a corresponding one of the plurality of registers and outputting a signal indicating a level set in accordance with a result of the multiplication; and an output section that adds together waveforms of the signals output from the plurality of calculating circuits, and outputs a resulting signal as the output signal.

3. The signal generator according to claim 2, wherein the waveform generating section further includes a plurality of sign control circuits that are provided in a one-to-one correspondence with the plurality of flip-flops and the plurality of registers, each of the plurality of sign control circuits determining a sign for the data value output from a corresponding one of the plurality of flip-flops and the data value output from a corresponding one of the plurality of registers.

4. The signal generator according to claim 1, further comprising a tap control section that selects a data value output from the pre-selected flip-flop from data values output from the plurality of flip-flops, and inputs the selected data value into a first-stage register among the plurality of registers.

5. The signal generator according to claim 1, wherein edges of the plurality of periodic signals excluding the first periodic signal are more densely distributed in a vicinity of an edge of the first periodic signal.

6. The signal generator according to claim 1, wherein a difference in phase between the first periodic signal and a periodic signal output from one of the plurality of timing generators excluding the first timing generator is set larger than a cycle of the first periodic signal.

7. A test apparatus for testing a device under test, comprising:
- a pattern generator that generates a test pattern to test the device;
- a signal generator that generates a test signal to be input into the device, based on the test pattern; and
- a judging section that judges whether the device is good or bad based on a signal output from the device,
- the signal generator including:
  - a plurality of timing generators that, based on a reference clock, generate a plurality of periodic signals each having a different phase with respect to the reference clock;
  - a shift register section including a plurality of flip-flops in a cascade arrangement through which each piece of data of the test pattern is propagated sequentially in response to a first periodic signal output from a first timing generator, the first periodic signal being one of the plurality of periodic signals and the first timing generator being one of the plurality of timing generators;
  - a plurality of registers that are provided in a cascade arrangement and in a one-to-one correspondence with the plurality of timing generators excluding the first timing generator, each of the plurality of registers sequentially propagating data output from a pre-selected one of the plurality of flip-flops in response to a periodic signal output from a corresponding one of the plurality of timing generators; and
  - a waveform generating section that generates a waveform of the test signal by multiplying a signal output from said plurality of flip-flops by a first predetermined coefficient, multiplying a signal output from said plurality of registers by a second predetermined coefficient, and adding together waveforms of the multiplied signals.

8. The test apparatus according to claim 7, wherein the waveform generating section includes:
- a plurality of calculating circuits that are provided in a one-to-one correspondence with the plurality of flip-flops and the plurality of registers, each of the plurality of calculating circuits multiplying, by the first predetermined coefficient, a data value output from a corresponding one of the plurality of flip-flops and, by the second predetermined coefficient, a data value output from a corresponding one of the plurality of registers and outputting a signal indicating a level set in accordance with a result of the multiplication; and
- an output section that adds together waveforms of the signals output from the plurality of calculating circuits, and outputs a resulting signal as the test signal.

9. The test apparatus according to claim 8, further comprising a calibrating section that calibrates the signal generator before the test apparatus tests the device, the calibrating section including:
- a reference generating section that causes the signal generator to output a reference signal having a predetermined waveform;
- a reference measuring section that measures the reference signal at a point when the reference signal is input into an input terminal of the device; and
- a control section that determines the coefficients for the plurality of calculating circuits based on a waveform of the reference signal measured by the reference measuring section.

10. A circuit device for outputting a signal having a desired waveform, comprising:
- a pattern generator that generates a waveform pattern for the output signal; and
- a signal generator that generates the output signal based on the waveform pattern, the signal generator including:
  - a plurality of timing generators that, based on a reference clock generate a plurality of periodic signals each having a different phase with respect to the reference clock;
  - a shift register section including a plurality of flip-flops in a cascade arrangement through which each piece of data of the waveform pattern is propagated sequentially in response to a first periodic signal output from a first timing generator, the first periodic signal being one of the plurality of periodic signals and the first timing generator being one of the plurality of timing generators;
  - a plurality of registers that are provided in a cascade arrangement and in a one-to-one correspondence with the plurality of timing generators excluding the first timing generator, each of the plurality of registers sequentially propagating data output from a pre-selected one of the plurality of flip-flops in response to a periodic signal output from a corresponding one of the plurality of timing generators; and
  - a waveform generating section that generates a waveform of the output signal by multiplying a signal output from said plurality of flip-flops by a first predetermined coefficient, multiplying a signal output from said plurality of registers by a second predetermined coefficient, and adding together waveforms of the multiplied signals.

* * * * *